(12) United States Patent
Tanabe et al.

(10) Patent No.: US 7,760,281 B2
(45) Date of Patent: Jul. 20, 2010

(54) LIQUID CRYSTAL DISPLAY DEVICE

(75) Inventors: Hideo Tanabe, Mobara (JP); Masaru Takabatake, Mobara (JP); Manabu Yamashita, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 129 days.

(21) Appl. No.: 12/232,791

(22) Filed: Sep. 24, 2008

(65) Prior Publication Data

US 2009/0079890 A1    Mar. 26, 2009

(30) Foreign Application Priority Data

Sep. 26, 2007    (JP)    ............... 2007-249252

(51) Int. Cl.
*G02F 1/1368* (2006.01)

(52) U.S. Cl. .............. 349/43; 349/42; 349/56; 349/122; 349/138

(58) Field of Classification Search .......... 349/43, 349/42, 45, 52, 56, 104, 106, 138, 139, 122, 349/158, 144, 145, 146
See application file for complete search history.

(56) References Cited

U.S. PATENT DOCUMENTS

| 7,411,216 | B2 | 8/2008 | Kim et al. ............ 257/72 |
| 2002/0145694 | A1 | 10/2002 | Jang ............ 349/138 |
| 2003/0103181 | A1* | 6/2003 | Imayama et al. ....... 349/122 |
| 2005/0062898 | A1* | 3/2005 | Imayama et al. ....... 349/43 |
| 2005/0179849 | A1 | 8/2005 | Nomura et al. ....... 349/149 |
| 2006/0152663 | A1 | 7/2006 | Kamoshida et al. ..... 349/149 |
| 2008/0074594 | A1* | 3/2008 | Tanabe et al. ........ 349/114 |
| 2009/0079890 | A1* | 3/2009 | Tanabe et al. ......... 349/43 |

FOREIGN PATENT DOCUMENTS

| JP | 2002-229058 | 5/2001 | ........ 349/149 X |
| JP | 2005-234091 | 2/2004 | ........ 349/149 X |
| JP | 2006-195075 | 1/2005 | ........ 349/149 X |

* cited by examiner

*Primary Examiner*—Brian M Healy
(74) *Attorney, Agent, or Firm*—Stites & Harbison PLLC; Juan Carlos A. Marquez, Esq.

(57) ABSTRACT

To take measures against defects in the conduction by preventing shavings of the orientation film from getting into the terminal portion for liquid crystal display devices using an organic passivation film on a TFT substrate.

Image signal lines 107 extend to a terminal portion. The image signal lines 107, excluding the terminal portion, are covered with an inorganic passivation film 108 and an organic passivation film 109. In the terminal portion, terminal portion through holes are created in the organic passivation film 109 and the inorganic passivation film 108, in order to make electrical connection possible. The terminal portion is covered with an ITO film 120 in order to protect the video signal lines 107. The taper angle θ in the organic passivation film 109 in the terminal portion through holes is 35 degrees or less, and the thickness of the organic passivation film 109 in the periphery of the terminal portion through holes is 300 nm to 600 nm, so that shavings of the orientation film can be prevented from getting into the terminal portion, and thus, defects in the conduction can be prevented.

10 Claims, 10 Drawing Sheets

LIQUID CRYSTAL DISPLAY DEVICE

The present application claims priority over Japanese Application JP 2007-249252 filed on Sep. 26, 2007, the contents of which are hereby incorporated into this application by reference.

BACKGROUND OF THE INVENTION (1) Field of the Invention

The present invention relates to a display device and, in particular, to a liquid crystal display device having higher reliability in the connection of terminal portions.

(2) Related Art Statement

Liquid crystal display devices have a TFT substrate on which pixel electrodes and thin film transistors (TFT's) are formed in a matrix and a facing substrate where color filters are formed in locations corresponding to the pixel electrodes, and liquid crystal is sandwiched between the TFT substrate and the facing substrate. In addition, the transmittance of light is controlled by liquid crystal molecules for each pixel, so that images are formed.

The TFT substrate is provided with video signal lines which extend in the longitudinal direction and are aligned in the lateral direction, and scanning lines which extend in the lateral direction and are aligned in the longitudinal direction, so that pixels are formed in regions surrounded by video signal lines and scanning lines. The pixels are mainly formed of a pixel electrode and a thin film transistor (TFT), which is a switching element. Thus, many pixels formed in a matrix form a display region.

In the display region on the TFT substrate, first TFT's are formed, an inorganic passivation film is formed from SiN on top of this, and an organic passivation film is further formed on top of this. The organic passivation film works to flatten the surface on which pixel electrodes are formed. Then, ITO, which is a transparent conductive film, is formed for the pixel electrodes on the flattened film.

Terminal portions for supplying power, video signals, scanning signals and the like to the display region from the outside are formed outside the display region on the TFT substrate. The terminal portions are formed in a process similar to that for the display region. That is to say, video signal lines and scanning lines extend to terminal portions through the sealing portion for pasting the TFT substrate and the facing substrate together so as to form a base metal for the terminal portions. The base metal for the terminal portions has the same layered structure as the video signal lines and the scanning lines.

The base metal for the terminal portions is covered with the inorganic passivation film and the organic passivation film. The inorganic passivation film and the organic passivation film are insulators, and therefore, through holes are created in these films in accordance with photolithography, so that it is possible for the terminal portions to be electrically connected to the outside. The metal easily corrodes in the air, and therefore, ITO, which is a chemically stable transparent conductive film, is formed so as to cover the through holes. There is an insulating film between the terminal portions. The organic passivation film has a particularly great film thickness as compared to the other insulating films. Accordingly, there is great unevenness in the terminal portions and the vicinity thereof as viewed in a cross section.

IC chips, such as video signal drivers, scanning signal drivers and the like, are connected to the terminal portions. In some cases, the IC chips are connected directly to the TFT substrate in accordance with a COG (chip-on-glass) method, and in other cases, the IC chips are mounted on a flexible film, which is then connected to the TFT substrate in accordance with a TAB (tape-automated bonding) method. In these cases, connection defects are easily caused, at the time of connection in accordance with COG and TAB methods, when there is great unevenness in the terminal portions.

In terms of cases where IC chips are connected in accordance with a COG method, Patent Document 1 describes a technology for reducing the thickness of the organic film in the terminal portions so that there is less unevenness in the terminal portions, and thus increasing the reliability in the connection of the IC chips in accordance with a COG method. As for cases where IC chips are connected in accordance with a COG method, Patent Document 2 described a technology for making the taper angle of the through holes created in the organic film in the terminal portions smaller than the taper angle of the through holes created in the organic film in the display region, and thus increasing the reliability in the connection of the IC chips. Patent document 3 describes a technology for reducing the film thickness of the organic film in the terminal portions and at the same time making the surface of the organic film uneven in the terminal portions so that the reliability in the connection between the film and the terminal portions can be increased when IC chips are connected in accordance with a TAB method.

(Patent Document 1) Japanese Unexamined Patent Publication 2002-229058 (Corresponding U.S. Application US2002/0145694 A1)

(Patent Document 2) Japanese Unexamined Patent Publication 2005-234091 (Corresponding U.S. Application US2005/0179849 A1)

(Patent Document 3) Japanese Unexamined Patent Publication 2006-195075 (Corresponding U.S. Application US2006/0152663 A1)

SUMMARY OF THE INVENTION

Problem to be Solved by the Invention

An inorganic passivation film and an organic passivation film are formed so as to cover the TFT's in the display region including pixels on the TFT substrate of liquid crystal displays, in order to protect the TFT substrate and flatten the surface on which pixel electrodes are formed. In particular, the organic passivation film works as a flattened film, and therefore, is formed as thick as approximately 1 μm to 4 μm. The inorganic passivation film and the organic passivation film extend out from of the sealing portion between the TFT substrate and the facing substrate so as to protect source/drain wires (hereinafter referred to as SD wires) and gate wires. Here, in the present specification, the SD wires are the same as the video signal lines, and the gate wires are the same as the scanning lines.

Figure 9:
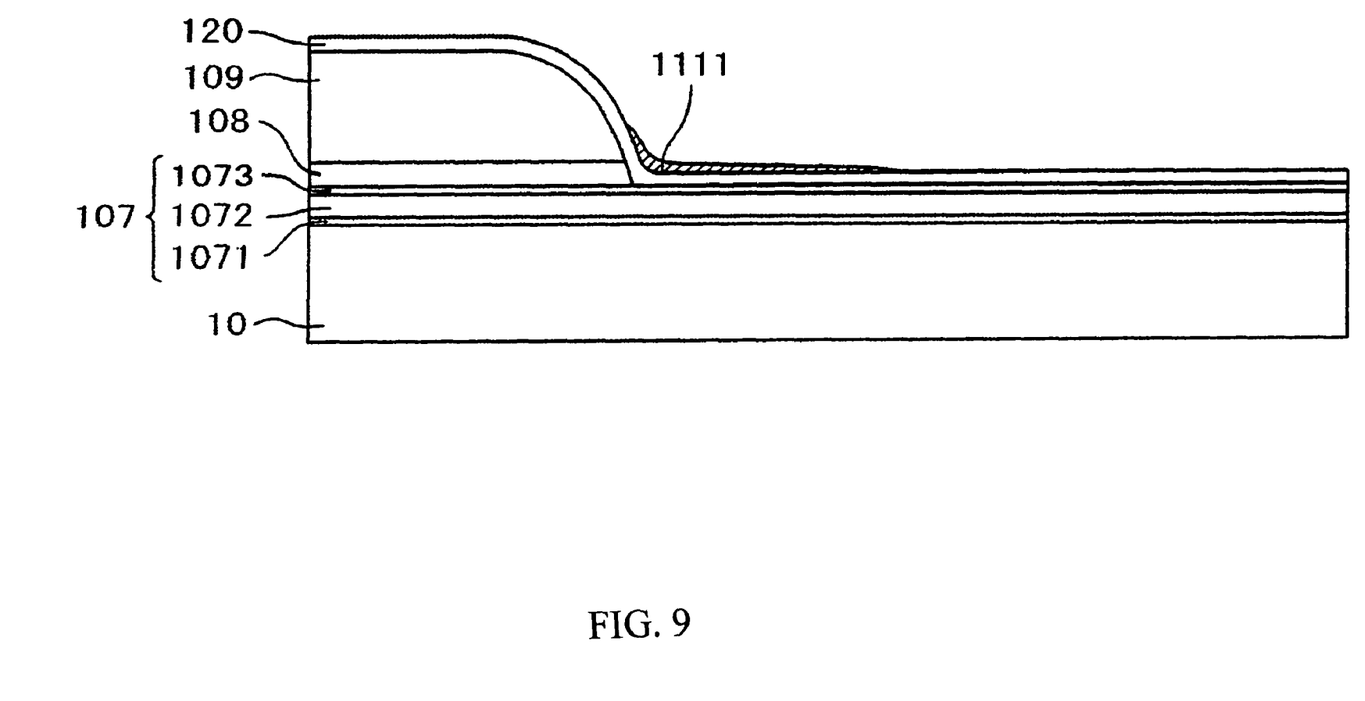
FIG. 9 is a cross sectional diagram showing a terminal portion according to the prior art.

FIG. 9 is a cross sectional diagram showing a conventional terminal portion. In FIG. 9, an SD wire 107 extends to the terminal portion. The SD wire 107 is protected by an inorganic passivation film 108 and an organic passivation film 109, and a through hole is created in the terminal portion, so that electrical connection of the terminal portion is possible, and the SD wire 107 is exposed. The SD wire 107 is made of a metal, and therefore, easily corrodes in the air. In order to prevent corrosion of the SD wire 107, the terminal portion is covered with a chemically stable conductive metal oxide film. ITO 120 is used as the conductive metal oxide film, and this ITO 120 is formed at the same time as the pixel electrodes.

Figure 10:
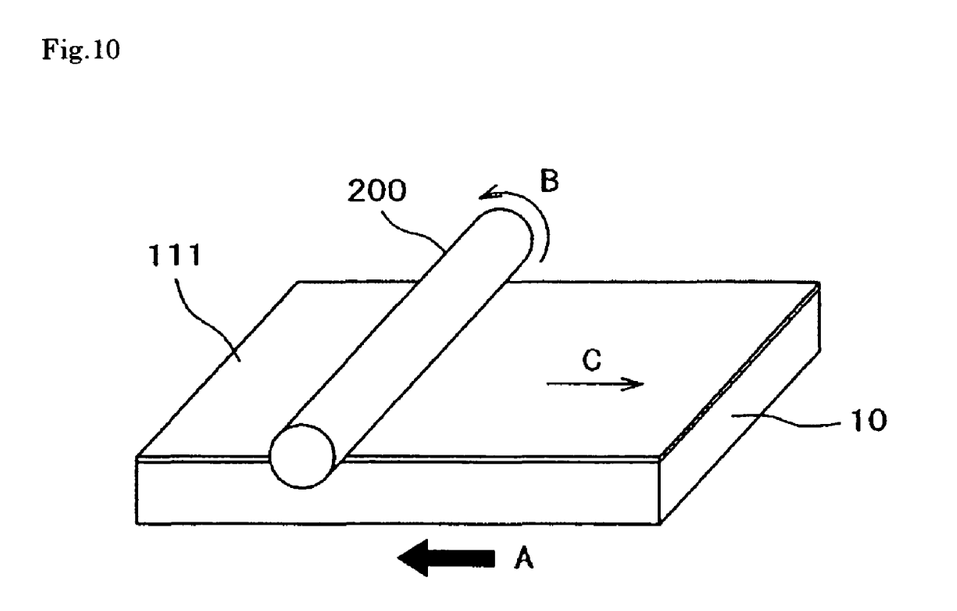
FIG. 10 is a schematic diagram illustrating a rubbing process.

After the formation of the pixel electrodes and the terminal portions in the liquid crystal display, an orientation film 111 is formed of polyimide or the like in the display region. This orientation film 111 initially works to orient the liquid crystal molecules in a subsequent rubbing process. As shown in FIG. 10, rubbing of the orientation film 111 is a process for rolling a cloth roller 200 over the orientation film 111, and thus rubbing the orientation film 111. In FIG. 10, the rubbing roller 200 is rolled in the direction B and pressed against the TFT substrate 10 on which the orientation film 111 is applied. In FIG. 10, the substrate moves in the direction of the arrow A. Thus, the orientation film 111 is rubbed in the same direction as the arrow C. Then, the initial orientation of the liquid crystal molecules becomes uniform in the direction of rubbing. Rubbing of the orientation film 111 means that countless small scratches are created on the orientation film. Accordingly, many shavings are created when the orientation film 111 is rubbed.

The shavings of the orientation film 111 get into recesses on the TFT substrate 10, if such recesses are present. In the terminal portions on the TFT substrate 10, through holes are created in the organic passivation film 109 and the inorganic passivation film 108. In particular, the organic passivation film 109 is thick, and therefore, deep recesses are created. Then, as shown in FIG. 9, shavings 1111 of the orientation film 111 get into and remain in the through holes. The shavings of the orientation film 111 are insulators, and therefore, when the shavings are on top of the ITO film 120, they cause defects in the conduction when the TFT substrate 10 and the flexible wire substrate are connected. Such defects in the conduction are in some cases found immediately after the manufacture of the liquid crystal display device, and defects in the conduction are caused after the product goes into the market, which is a serious problem.

Though Patent Documents 1, 2 and 3 describe different technologies according to which the film thickness of the organic film is reduced in the terminal portions or the taper of the through holes in the organic film is reduced in the terminal portions, the object of the technologies described in these documents relates to the contact pressure in the terminal portions when IC chips are connected in accordance with a COG of TAB method, and the configuration of the terminal portions disclosed in these documents do not deal with defects in the conduction caused by shavings of the orientation film 111.

An object of the present invention is to prevent defects from being caused in the conduction by shavings of the orientation film 111 which enter into the terminal portions in liquid crystal display devices where an organic flattened film is used in the display region.

Means for Solving Problem

The present invention is provided in order to overcome the above described problems, and the main means is to reduce the film thickness of the organic insulating film formed around the periphery of the through holes in the terminal portions and reduce the taper angle of the through holes in the terminal portions so that the shavings of the orientation film can be prevented from remaining in the terminal portions. Concrete means are as follows.

(1) A liquid crystal display device having a display region where pixels including a pixel electrode and a TFT are formed in regions surrounded by video signal lines and scanning lines, and terminal portions formed outside the above described display region, characterized in that an organic insulating film is formed so as to cover the above described TFT, and the organic insulating film in the above described pixel portion has a thickness of 1 µm to 4 µm, the above described pixel electrode is formed on top of the above described organic insulating film, and a pixel portion through hole for electrically connecting the above described pixel electrode and the above described TFT is created in the above described organic insulating film, a video signal line or a scanning line extends to the above described terminal portion outside the above described display region, and the above described video signal line or scanning line is covered with the above described organic insulating film, and a terminal portion through hole is created in the above described organic insulating film in the above described terminal portion, the above described organic insulating film in the periphery of the above described terminal portion through hole has a thickness of 300 nm to 600 nm, the taper angle of the above described terminal portion through hole in the above described organic insulating film is smaller than the taper angle of the above described pixel portion through hole in the above described organic insulating film, and the taper angle of the above described terminal portion through hole in the above described organic insulating film is 5 degrees to 35 degrees.

(2) The liquid crystal display device according to (1), characterized in that the taper angle of the above described terminal portion through hole in the above described organic insulating film is 20 degrees to 30 degrees.

(3) The liquid crystal display device according to (1), characterized in that there is an inorganic insulating film beneath the above described organic insulating film in the above described terminal portion.

(4) A liquid crystal display device having a display region where pixels including a pixel electrode and a TFT are formed in regions surrounded by video signal lines and scanning lines, and terminal portions formed outside the above described display region, characterized in that an organic insulating film is formed so as to cover the above described TFT, and the organic insulating film in the above described pixel portion has a thickness of 1 µm to 4 µm, the above described pixel electrode is formed on top of the above described organic insulating film, and a pixel portion through hole for electrically connecting the above described pixel electrode and the above described TFT is created in the above described organic insulating film, a video signal line or a scanning line extends to the above described terminal portion outside the above described display region, and the above described video signal line or scanning line is covered with the above described organic insulating film, and a terminal portion through hole is created in the above described organic insulating film in the above described terminal portion, the above described organic insulating film in the periphery of the above described terminal portion through hole has a thickness of 100 nm to 600 nm, the taper angle of the above described terminal portion through hole in the above described organic insulating film is smaller than the taper angle of the above described pixel portion through hole in the above described organic insulating film, and the taper angle of the above described terminal portion through hole in the above described organic insulating film is 20 degrees or less.

(5) The liquid crystal display device according to (4), characterized in that there is an inorganic insulating film beneath the above described organic insulating film in the above described terminal portion.

(6) A liquid crystal display device having a display region where pixels including a pixel electrode and a TFT are formed in regions surrounded by video signal lines and scanning lines, and terminal portions formed outside the above described display region, characterized in that an organic insulating film is formed so as to cover the above described TFT, and the organic insulating film in the above described pixel portion has a thickness of 1 μm to 4 μm, the above described pixel electrode is formed on top of the above described organic insulating film, and a pixel portion through hole for electrically connecting the above described pixel electrode and the above described TFT is created in the above described organic insulating film, a video signal line or a scanning line extends to the above described terminal portion outside the above described display region, and the above described video signal line or scanning line is covered with the above described organic insulating film, and a terminal portion through hole is created in the above described organic insulating film in the above described terminal portion, the film thickness of the above described organic insulating film in the periphery of the above described terminal portion through hole is smaller than the film thickness of the above described organic insulating film in the above described pixel portion after half-tone exposure to light, the taper angle of the above described terminal portion through hole in the above described organic insulating film is smaller than the taper angle of the above described pixel portion through hole in the above described organic insulating film, and the taper angle of the above described terminal portion through hole in the above described organic insulating film is 5 degrees to 35 degrees.

(7) The liquid crystal display device according to (6), characterized in that the film thickness of the above described organic insulating film in the periphery of the above described terminal portion through hole is 300 nm to 600 nm.

(8) The liquid crystal display device according to (6), characterized in that the taper angle of the above described terminal portion through hole in the above described organic insulating film is 20 degrees to 30 degrees.

(9) A liquid crystal display device having a display region where pixels including a pixel electrode and a TFT are formed in regions surrounded by video signal lines and scanning lines, and terminal portions formed outside the above described display region, characterized in that an organic insulating film is formed so as to cover the above described TFT, and the organic insulating film in the above described pixel portion has a thickness of 1 μm to 4 μm, the above described pixel electrode is formed on top of the above described organic insulating film, and a pixel portion through hole for electrically connecting the above described pixel electrode and the above described TFT is created in the above described organic insulating film, a video signal line or a scanning line extends to the above described terminal portion outside the above described display region, and the above described video signal line or scanning line is covered with the above described organic insulating film, and a terminal portion through hole is created in the above described organic insulating film in the above described terminal portion, the film thickness of the above described organic insulating film in the periphery of the above described terminal portion through hole is smaller than the film thickness of the above described organic insulating film in the above described pixel portion after multiple gradation half-tone exposure to light, the taper angle of the above described terminal portion through hole in the above described organic insulating film is smaller than the taper angle of the above described pixel portion through hole in the above described organic insulating film, and the taper angle of the above described terminal portion through hole in the above described organic insulating film is 20 degrees or less.

(10) The liquid crystal display device according to (9), characterized in that the film thickness of the above described organic insulating film in the periphery of the above described terminal portion through hole is 100 nm to 600 nm.

EFFECTS OF THE INVENTION

According to the present invention, the film thickness of the organic insulating film in the periphery of the through holes in the terminal portions is reduced, and the taper angle of the through holes in the organic insulating film is smaller than the taper angle of the through holes in the organic insulating film in the pixel portions. Accordingly, shavings of the orientation film created when the orientation film is rubbed get into the through holes in the terminal portions, and thus, defects can be prevented from being caused in the conduction when an external circuit and the liquid crystal display device are connected. As a result, a highly reliable liquid crystal display device can be implemented.

EXPLANATIONS OF SYMBOLS

10 . . . TFT substrate
101 . . . first base film
102 . . . second base film
103 . . . semiconductor layer
104 . . . gate insulating film
105 . . . gate wire (gate electrode)
107 . . . SD wire (SD electrode)
108 . . . inorganic passivation film
109 . . . organic passivation film
110 . . . pixel electrode
111 . . . orientation film
120 . . . terminal portion ITO
130 . . . drain electrode
200 . . . rubbing roller
1111 . . . shavings of orientation film

DETAILED DESCRIPTION OF THE INVENTION

Best Mode for Carrying Out the Invention

The contents of the present invention are disclosed in more detail on the basis of the embodiments.

First Embodiment

Figure 1:
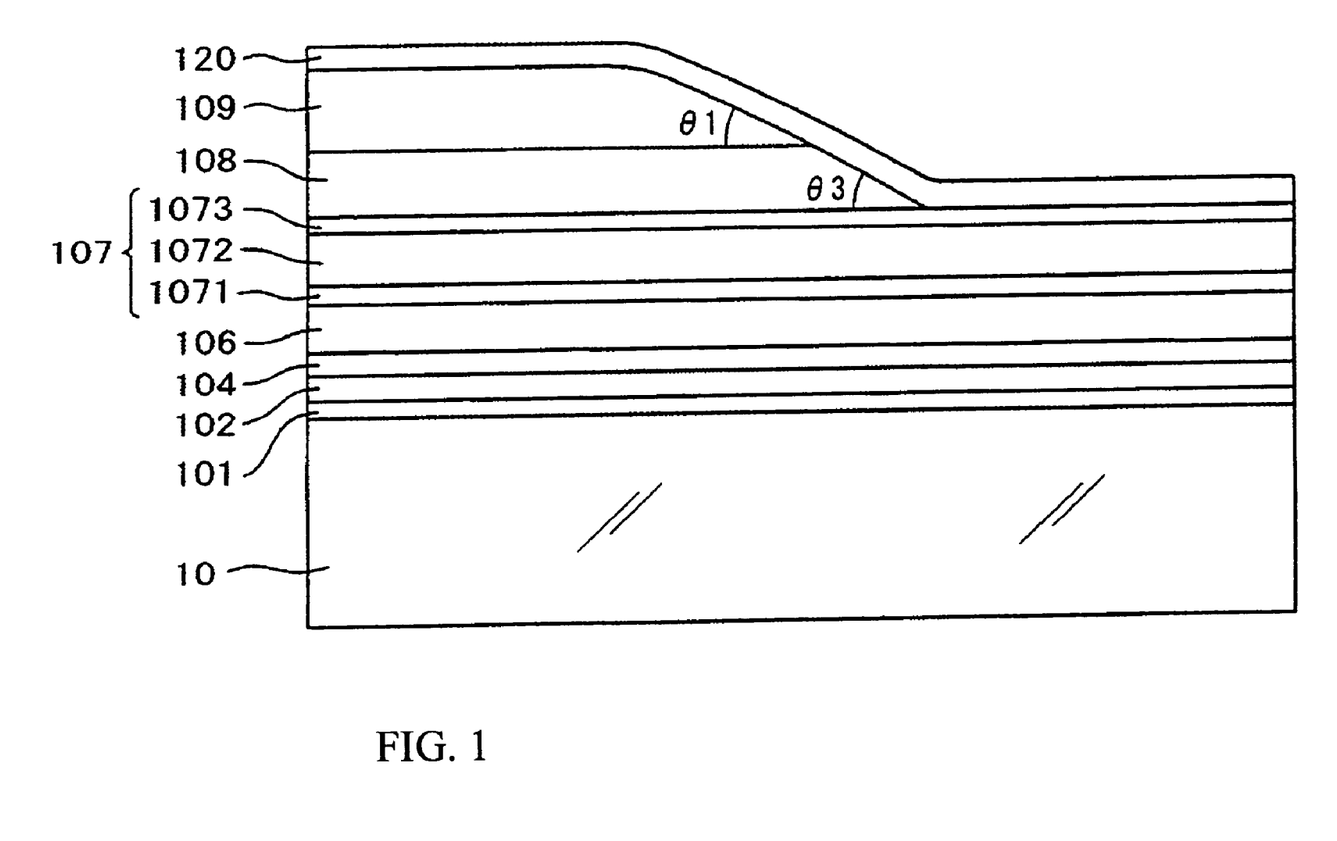
FIG. 1 is a cross sectional diagram showing a terminal portion according to the first embodiment.
Figure 2:
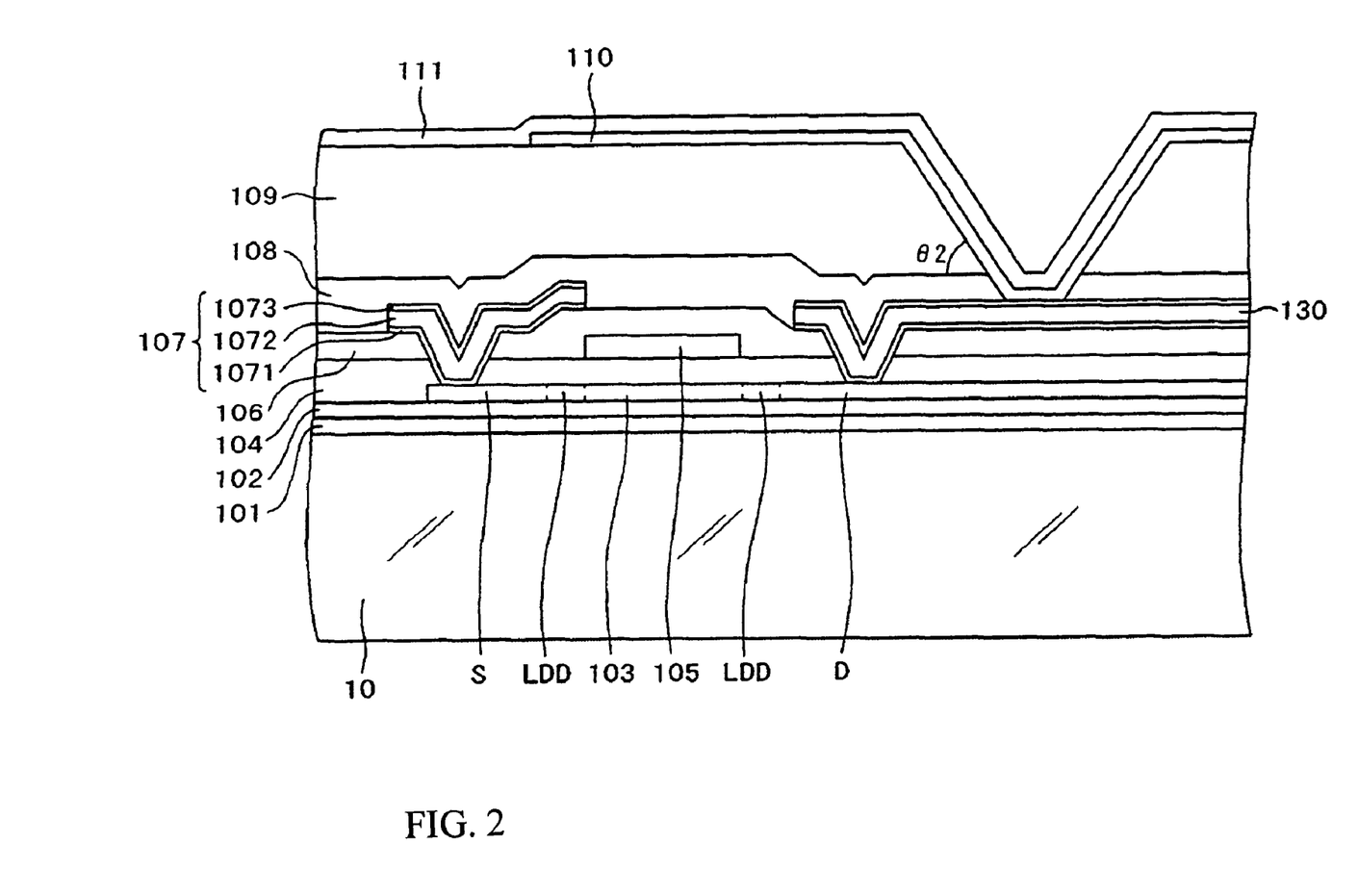
FIG. 2 is a cross sectional diagram showing a pixel portion according to the first embodiment.

FIG. 1 is a schematic cross sectional diagram showing the configuration of the first embodiment. In addition, FIG. 2 is a cross sectional diagram showing a pixel portion corresponding to FIG. 1. FIGS. 1 and 2 show a liquid crystal display device using poly-Si for TFT's. FIG. 1 is a cross sectional diagram showing the structure of a terminal portion. FIG. 1 shows a configuration corresponding to a terminal portion in a liquid crystal display device having TFT's where poly-Si is used in the pixel portions. In FIG. 1, a wire extends outward from the display portion of a liquid crystal display device. This SD wire 107 is formed of a barrier layer 1071 made of MoW, an AlSi layer 1072 and an SD cap layer 1073 made of MoW. The terminal portion is initially covered with an inorganic passivation film 108 and an organic passivation film 109, but a through hole is created in the terminal portion through photolithography, so that the terminal portion can be electrically connected to an external circuit through this through hole.

The SD wire 107 is formed of a metal, and therefore, corrodes in external environments. In order to prevent this, the SD wire 107 exposed from the through hole is covered with a transparent conductive film made of a chemically stable metal oxide. For the transparent conductive film, ITO (indium tin oxide) can be used, for example. Here, the terminal portion, excluding the through hole, is covered with the inorganic passivation film 108 and the organic passivation film 109, and therefore, the SD wire 107 does not corrode.

The taper angle of the wall portion of the through hole created in the inorganic passivation film 108 and the organic passivation film 109, particularly the taper angle θ1 of the organic passivation film 109, is 5 degrees to 35 degrees, or 20 degrees to 30 degrees, preferably 20 degrees or less. Thus, the taper angle of the organic passivation film 109 having a great thickness is small, and shavings 1111 of the orientation film created in the rubbing process can be prevented from getting into the terminal portion after the completion of the TFT substrate 10, and defects can be prevented from being caused in the conduction.

Meanwhile, shavings 1111 of the orientation film do not get into the terminal portion if there is no organic passivation film 109 in the periphery of the terminal portion. However, the organic passivation film 109 works to prevent the SD wire 107 from corroding from pinholes in the inorganic passivation film 108 in the periphery of the terminal portion, and at the same time, is essential as a flattened film in the pixel portion. The terminal portion is formed in the same process as the pixel portion.

FIG. 2 is a cross sectional diagram showing the pixel portion formed simultaneously with the terminal portion in FIG. 1, particularly the TFT portion. In FIG. 1, a first base film 101 made of SiN and a second base film 102 made of $SiO_2$ are formed on top of a glass substrate 10 in accordance with a CVD method. The first base film 101 and the second base film 102 work to prevent the semiconductor layer 103 from being contaminated with impurities from the glass substrate 10.

The semiconductor layer 103 is formed on top of the second base film 102. This semiconductor layer 103 is gained by forming an α-Si film on top of the second base film 102 in accordance with a CVD method and converting it to a poly-Si film through laser annealing. This poly-Si film is patterned through photolithography.

A gate insulating film 104 is formed on top of a semiconductor film. This gate insulating film 104 is an $SiO_2$ film made from TEOS (tetraethoxysilane). This film is also formed in accordance with a CVD method. A gate electrode 105 is formed on top of this. The gate electrode 105 is in the same layer as the gate wire 105, and the two are formed at the same time. The gate electrode 105 is formed of an MoW film. An Al alloy is used in the case where it is necessary to reduce the resistance of the gate wire 105.

The gate electrode 105 is patterned through photolithography, and during patterning, the poly-Si layer is doped with an impurity, such as phosphorous or boron through ion implantation, so that a source S or a drain D is formed in the poly-Si layer. In addition, the photoresist for patterning the gate electrode 105 may be used to form an LDD (lightly doped drain) layer between the channel layer and the source S or the drain D in the poly-Si layer.

After that, an interlayer insulating film 106 is formed of $SiO_2$ so as to cover the gate electrode 105 and the gate wire 105. The interlayer insulating film 106 is to insulate the gate wire 105 from the SD wire 107. The SD electrode 107 is formed on top of the interlayer insulating film 106. The SD electrode 107 is in the same layer as the SD wire 107, and the two are formed at the same time. An AlSi alloy is used to reduce the resistance in the SD wire 107. The AlSi alloy may generate a hillock, or Al may diffuse into another layer, and therefore, the alloy is sandwiched between the barrier layer 1071 made of MoW and the SD cap layer 1073.

In order to connect the SD wire 107 (which works also as source electrode) and the source S of the TFT, a through hole is created in the gate insulating film 104 and the interlayer insulating film 106, and thus, the source S of the TFT and the SD wire 107 are connected. The drain electrode 130 formed at the same time as the SD wire 107 is connected to the drain D of the TFT. In order to protect the entirety of the TFT by covering the SD wire 107 and the drain electrode 130, an inorganic passivation film 108 is provided. The inorganic passivation film 108 is formed in accordance with a CVD method, as is the first base film 101. An organic passivation film 109 is formed so as to cover the inorganic passivation film 108. The organic passivation film 109 is formed of a photosensitive acryl resin or the like. The organic passivation film 109 works as a flattened film, and therefore, has a great thickness. The film thickness of the organic passivation film 109 is 1 μm to 4 μm, in many cases 2 μm to 3 μm.

A pixel electrode 110 is formed on top of the organic passivation film 109, and a through hole is created in the inorganic passivation film 108 and the organic passivation film 109, in order to electrically connect the pixel electrode 110 to the drain electrode 130. The organic passivation film 109 uses a photosensitive resin. After the application of the photosensitive resin, only the portions of the resin exposed to light are dissolved in a certain developer. That is to say, by using a photosensitive resin, it becomes unnecessary to form a photoresist.

After creating a through hole in the organic passivation film 109, a through hole is created in the organic passivation film 108 through dry etching using the organic passivation film 109 as a resist. Thus, a through hole for electrically connecting the drain electrode 130 to the pixel electrode 110 is created. After that, ITO is layered on the flattened film and in the through hole through sputtering and then patterned, so that the pixel electrode 110 is formed.

After that, an orientation film 111 is applied so as to cover the pixel electrode 110. After the orientation film 111 is applied and dried, it is rubbed, as described above. Rubbing of the orientation film 111 means that countless scratches are created on the orientation film 111, and therefore, shavings of the orientation film 111 are created, and such shavings of the orientation film 111 get into recesses in the TFT substrate 10. Even if shavings of the orientation film 111 get into the through holes in the organic passivation film 109 in the display portion, this does not pose any problem. This is because the orientation film 111 is applied in this portion beforehand.

When shavings of the orientation film 111 get into recesses in the terminal portion, however, there are problems, such that there are defects in the conduction.

The terminal portion is formed at the same time as the pixel portion. The structure of the terminal portion in the cross section in FIG. 1 is compared to the structure of the pixel portion in FIG. 2 below. In FIG. 1, the first base film 101 and the second base film 102 are formed on top of the glass substrate 10. An $SiO_2$ film 104 is formed from TEOS on top of the second base film 102, and an interlayer insulating film 106 is further formed of an $SiO_2$ film on top of this.

In FIG. 1, the SD wire 107 electrically connected to the display portion having a pixel portion on top of the interlayer insulating film 106 extends to the terminal portion. The SD wire 107 is formed of an AlSi layer 1072, a barrier layer 1071 made of MoW, and an SD cap layer 1073. An inorganic passivation film 108 and an organic passivation film 109 are formed on top of the SD wire layer 107. The inorganic passivation layer 108 protects the SD wire 107 extending to the terminal portion from the outside air. Though there are pinholes in the inorganic passivation film 108, the organic passivation film 109 formed on top of the inorganic passivation film 108 clogs these pinholes, so that the protection of the SD wire 107 is secured.

In order to electrically connect the SD wire 107 to the outside, a through hole is created in the inorganic passivation film 108 and the organic passivation film 109 so that the SD wire 107 is exposed. The SD wire 107 is made of a metal, and corrodes in the external environment. In order to prevent the SD wire 107 from corroding, the terminal portion is covered with an ITO film, which is chemically stable conductive metal oxide. The ITO 120 in the terminal portion is formed at the same time as the ITO for the pixel electrode 110.

In FIG. 1, there are no shavings of the orientation film 111 in the terminal portion, even after rubbing. This is because the organic passivation film 109 in FIG. 1 is thin, and the taper angle within the through hole in the organic passivation film 109 is small. In the present embodiment, the film thickness of the organic passivation film 109 within the pixels is 3 μm, while the thickness of the organic passivation film 109 in the periphery of the terminal portion is 300 nm to 600 nm.

In addition, the taper angle of the organic passivation film 109 in the terminal portion is 5 degrees to 35 degrees. The taper angle of the organic passivation film 109 in the terminal portion may be 20 degrees to 35 degrees. In addition, it is also possible to make the angle 20 degrees or less, depending on the method for exposing the organic passivation film 109 in the terminal portion to light. In addition, it is also possible to make the film thickness of the organic passivation film 109 in the periphery of the through hole in the terminal portion approximately 100 nm. Naturally, the taper angle θ1 of the through hole created in the organic passivation film 109 in the terminal portion is smaller than the taper angle θ2 of the through hole created in the pixel portion.

Figure 3:
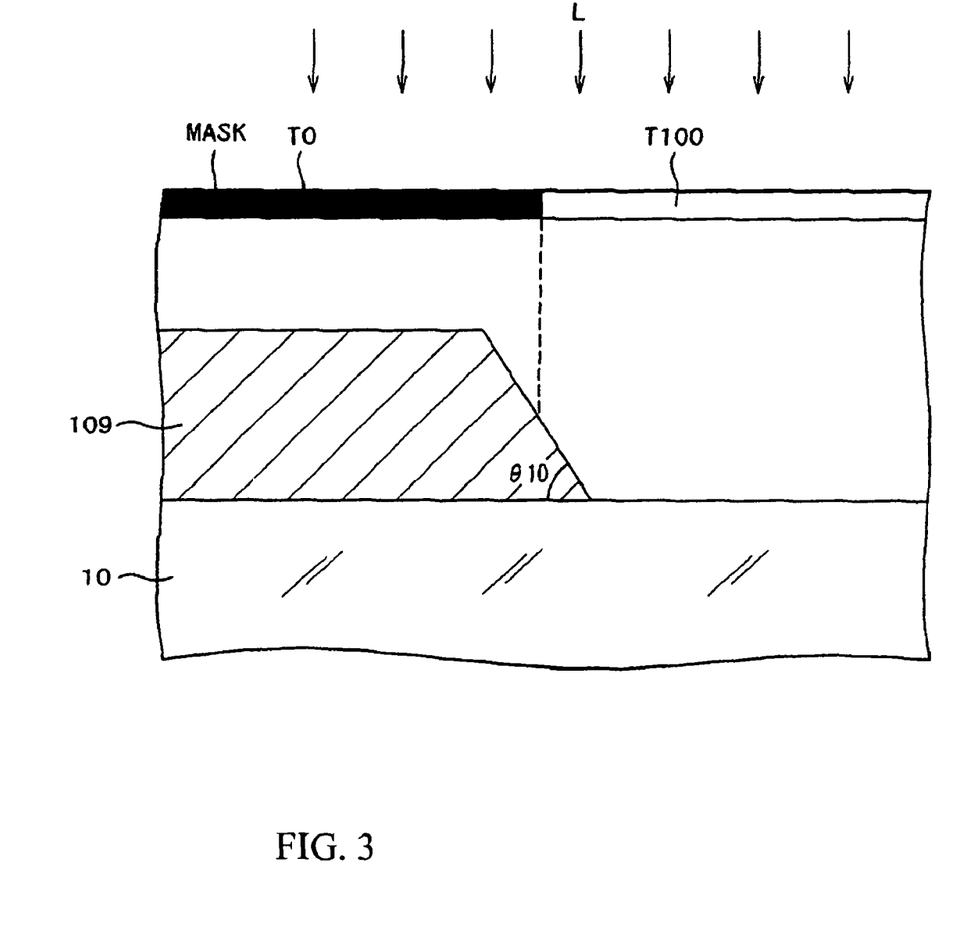
FIG. 3 is a schematic diagram illustrating conventional exposure to light.
Figure 4:
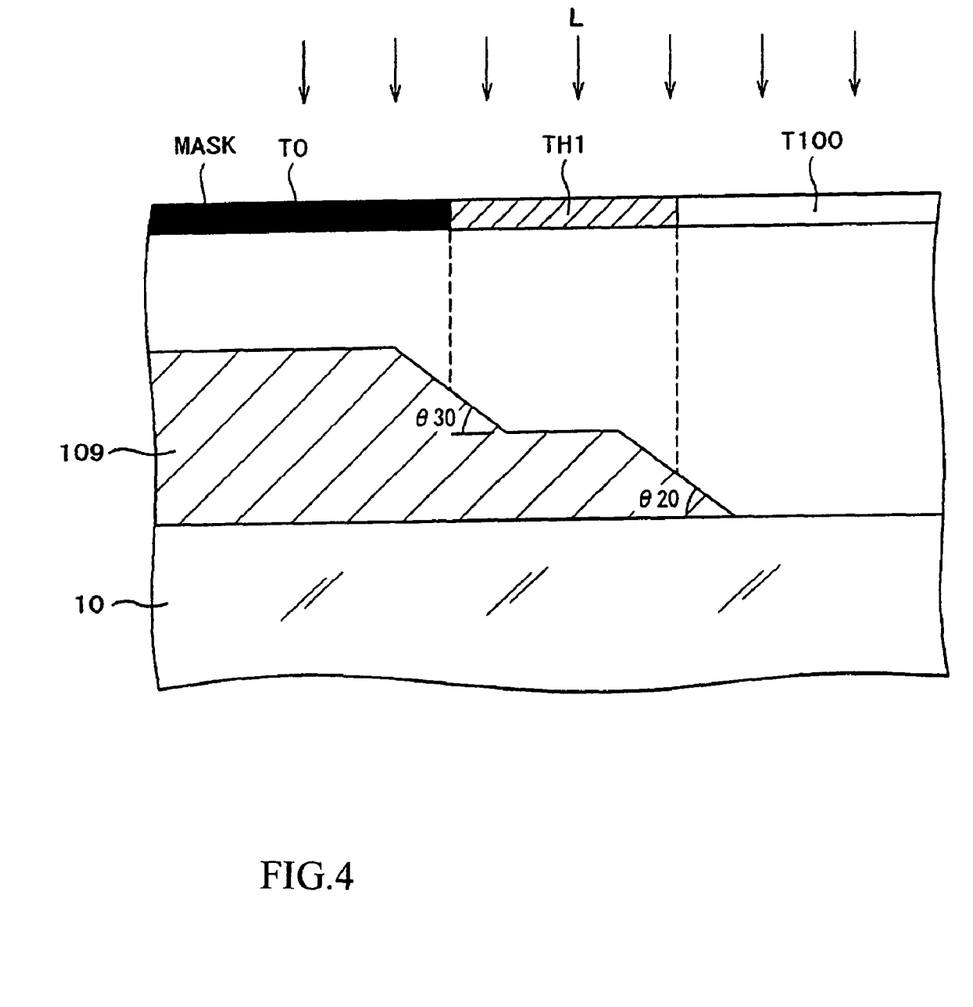
FIG. 4 is a schematic diagram illustrating half-tone exposure to light.
Figure 5:
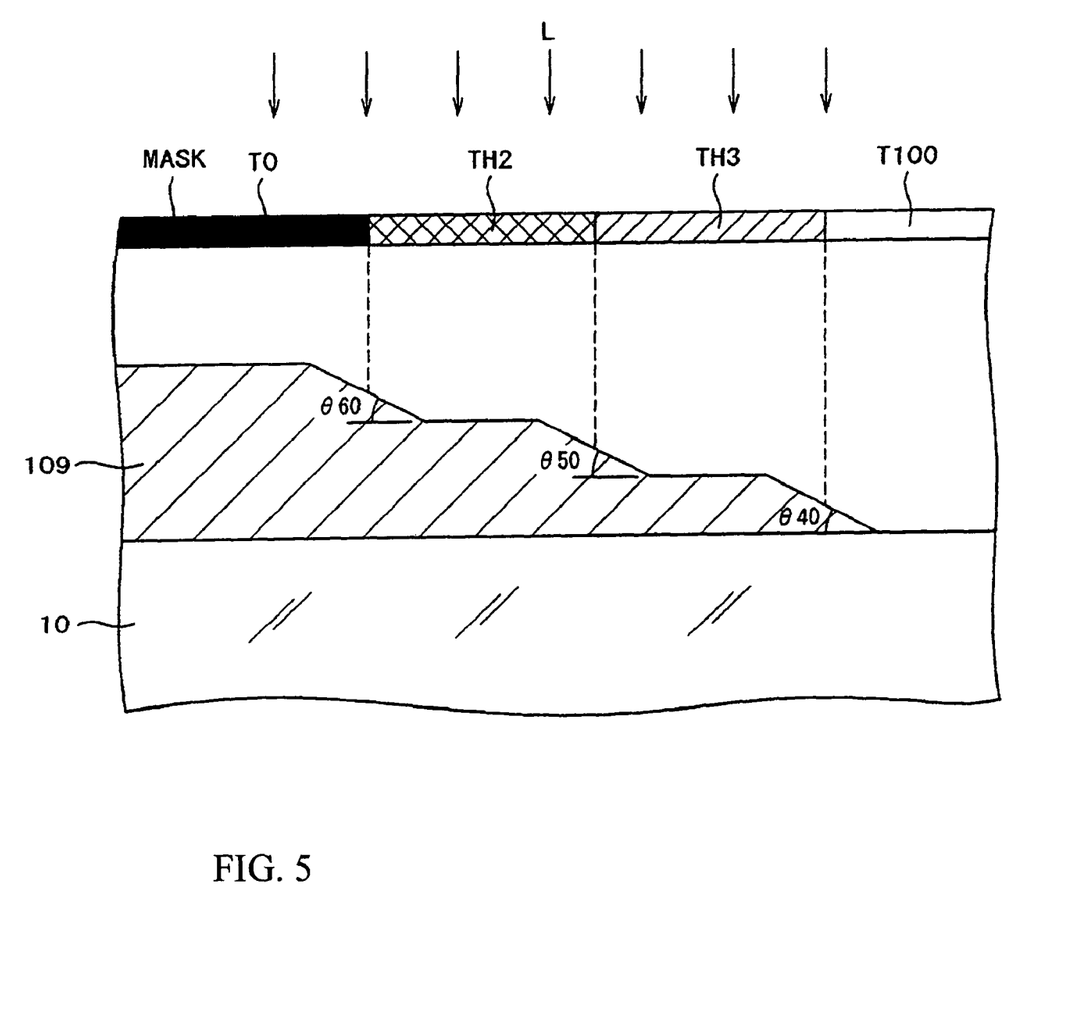
FIG. 5 is a schematic diagram illustrating multiple gradation half-tone exposure to light.

Thus, in order to make the taper angle of the through hole in the terminal portion smaller than the taper angle of the through hole in the pixel portion, half-tone exposure to light is carried out on the passivation film 109 in the periphery of the terminal portion, and after that, the organic passivation film 109 is developed. FIGS. 3, 4 and 5 are schematic diagrams illustrating conventional exposure to light, half-tone exposure to light and multiple gradation half-tone exposure to light. FIG. 3 illustrates patterning through conventional exposure to light, used instead of half-tone exposure to light. This method for exposure to light is for creating the through hole in the pixel portion.

In FIG. 3, the portion T0 of the mask MASK is where the transmittance of light L is zero. In addition, the portion T100 of the mask is where the transmittance of light L is 100%. A through hole is created in the organic passivation film 109 in the portion where the transmittance of light L is 100%. In the border portion, where the transmittance of the mask changes, the through hole in the organic passivation film 109 is tapered by a specific angle θ10.

FIG. 4 shows the film thickness of the organic passivation film 109 and the taper angle of the through hole in the case of half-tone exposure to light. In the mask MASK shown in FIG. 4, T0 is a portion where the transmittance of light L is zero, and TH1 is a portion where the transmittance is 30%, for example, and T100 is a portion where the transmittance is 100%. Half-tone exposure to light is carried out in the portion TH1 of the mask. In this portion of the mask, lines and spaces, for example, repeat in a pattern, so that the transmittance of the mask changes. In the case where the area of lines is great in comparison with the area of spaces, the transmittance becomes less by the difference in the mask.

In the half-tone portion, the photosensitive organic passivation film 109 is sufficiently exposed to light, and therefore, the reaction does not progress sufficiently in the organic passivation film 109, and the organic passivation film 109 is not completely removed when the organic passivation film 109 is developed. The thickness of the half-tone portion in the organic passivation film 109 is determined by the transmittance of the mask. That is to say, the greater the transmittance of the mask is in the half-tone portion, the smaller the film thickness of the organic passivation film 109 is in the same portion.

Another important point of half-tone exposure to light is that the taper angle of the through hole in the half-tone portion can be made smaller by reducing the film thickness of the organic passivation film 109 in the half-tone portion. As can be seen from the comparison between θ10 in FIG. 3 and θ20 in FIG. 4, the taper angle θ20 in FIG. 4 is smaller than the taper angle θ10 in FIG. 3. This is because there is less change in the transmittance of the mask in the wall portion of the through hole in the case of half-tone exposure to light. In addition, the taper angle θ30 in the portion where the transmittance of the mask in FIG. 4 changes from TH1 to T0 is also smaller than the taper angle θ10 in FIG. 3. According to the present invention, half-tone exposure to light is carried out in the periphery of the terminal portion, and thus, the film thickness of the organic passivation film 109 is reduced in the periphery of the terminal portion, and at the same time, the taper angle of the through hole is made smaller. More concretely, the portion T0 is used for the display portion, the portion T100 is used for the through holes in the display portion, the portion TH1 is used in the periphery of the terminal portion (excluding the display portion), and the portion T100 is used for the terminal portion through holes.

FIG. 5 is a schematic diagram illustrating multiple gradation half-tone exposure to light. In the mask MASK shown in FIG. 5, the portion T0 is where the transmittance is zero, and the portion T100 is where the transmittance of light is 100%. The portions TH2 and TH3 in the mask are where the transmittance of light is 20% and 50%, for example. The film thickness of the corresponding organic passivation film 109 changes depending on the amount of light to which the organic passivation film 109 is exposed.

The taper angle θ40 at the bottom of the through hole in the organic passivation film 109 in FIG. 5 is smaller than the taper angle θ20 at the bottom of the through hole in the organic passivation film 109 in FIG. 4. Likewise, the film thickness in the periphery of the through hole is smaller. Thus, the taper angle of the through hole can be made smaller using multiple gradation half-tone exposure to light than using conventional half-tone exposure to light, and the film thickness of the organic passivation film 109 in the periphery of the through hole can also be made smaller.

The taper angle at the bottom of the through hole is 20 degrees or less when multiple gradation half-tone exposure to light is used, as in FIG. 5, for example, and thus, the thickness of the organic passivation film 109 in the periphery of the through hole can be reduced to approximately 100 nm. More concretely, the portion TH2 or TH3 is used in the periphery of the terminal portion (excluding the display portion) and the portion T100 is used for the through hole in the terminal portion.

Though in the present embodiment, a case where multiple gradation half-tone exposure to light is carried out using a multiple gradation mask is described, multiple gradation halftone exposure to light can be easily carried out with the same effects when the resist is irradiated and exposed directly to light in a desired pattern without using a mask, or when a so-called maskless direct drawing method is used.

Here, according to the present invention, the film thickness and the taper angle of the through hole are reduced using half-tone exposure to light in the periphery of the terminal portion in the organic passivation film 109 having a great film thickness. In order for the through hole to penetrate through the organic passivation film 109 and reach the SD wire 107, it is necessary for the through hole to be created in the inorganic passivation film 108 formed beneath the organic passivation film 109. A through hole is created in the inorganic passivation film 108 through etching using the organic passivation film 109 as a resist.

Figure 6:
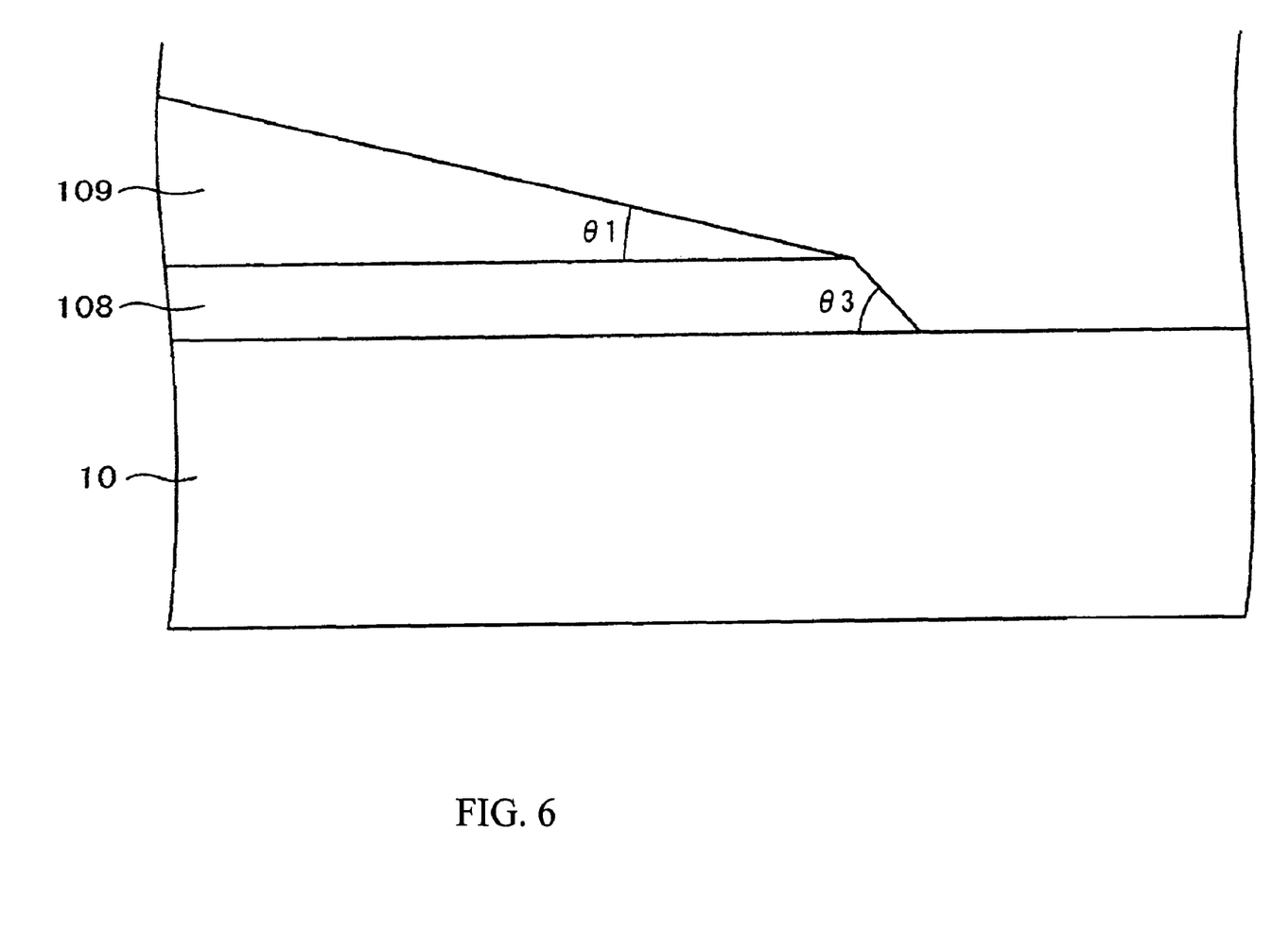
FIG. 6 is a cross sectional diagram showing an example of a terminal portion through hole.

The etching for the inorganic passivation film 108 is different from the etching for the organic passivation film 109, and therefore, the taper angle of the through hole in the inorganic passivation film 108 does not necessarily coincide with the taper angle of the through hole in the organic passivation film 109. As shown in FIG. 6, the taper angle θ3 of the through hole in the inorganic passivation film 108 is in some cases greater than the taper angle θ1 of the through hole in the organic passivation film 109. However, the original film thickness of the inorganic passivation film 108 is as small as 300 nm to 500 nm, and therefore, there are no major problems with the shavings 1111 of the orientation film sticking to the surface, even when the taper angle is slightly large.

As described above, according to the present invention, half-tone exposure to light or multiple gradation half-tone exposure to light is carried out on the terminal portion through hole in the organic passivation film 109 and the periphery thereof, and thus, the film thickness of the organic passivation film 109 can be reduced in the periphery of the through hole and the taper angle of the through hole can be made smaller, so that shavings 1111 of the orientation film is prevented from getting into the terminal portion as residue, and defects can be prevented in the conduction.

Second Embodiment

The first embodiment is an embodiment where the terminal portion has a structure corresponding to a case where a so-called top gate type TFT is formed in the pixel portion. Top gate type TFT's are widely used for liquid crystal display devices where so-called LTPS (low temperature poly-Si) TFT's are used. LTPS type TFT's have so far been used in relatively small-scale liquid crystal display devices. The present invention can be applied to so-called bottom gate type TFT's, in addition to LTPS type liquid crystal display devices. In many cases, α-Si is used in the channel portion of bottom gate type TFT's. The manufacture of α-Si is easy in comparison with poly-Si, and therefore, α-Si is used in relatively large-scale liquid crystal display devices, such as TVs.

Figure 7:
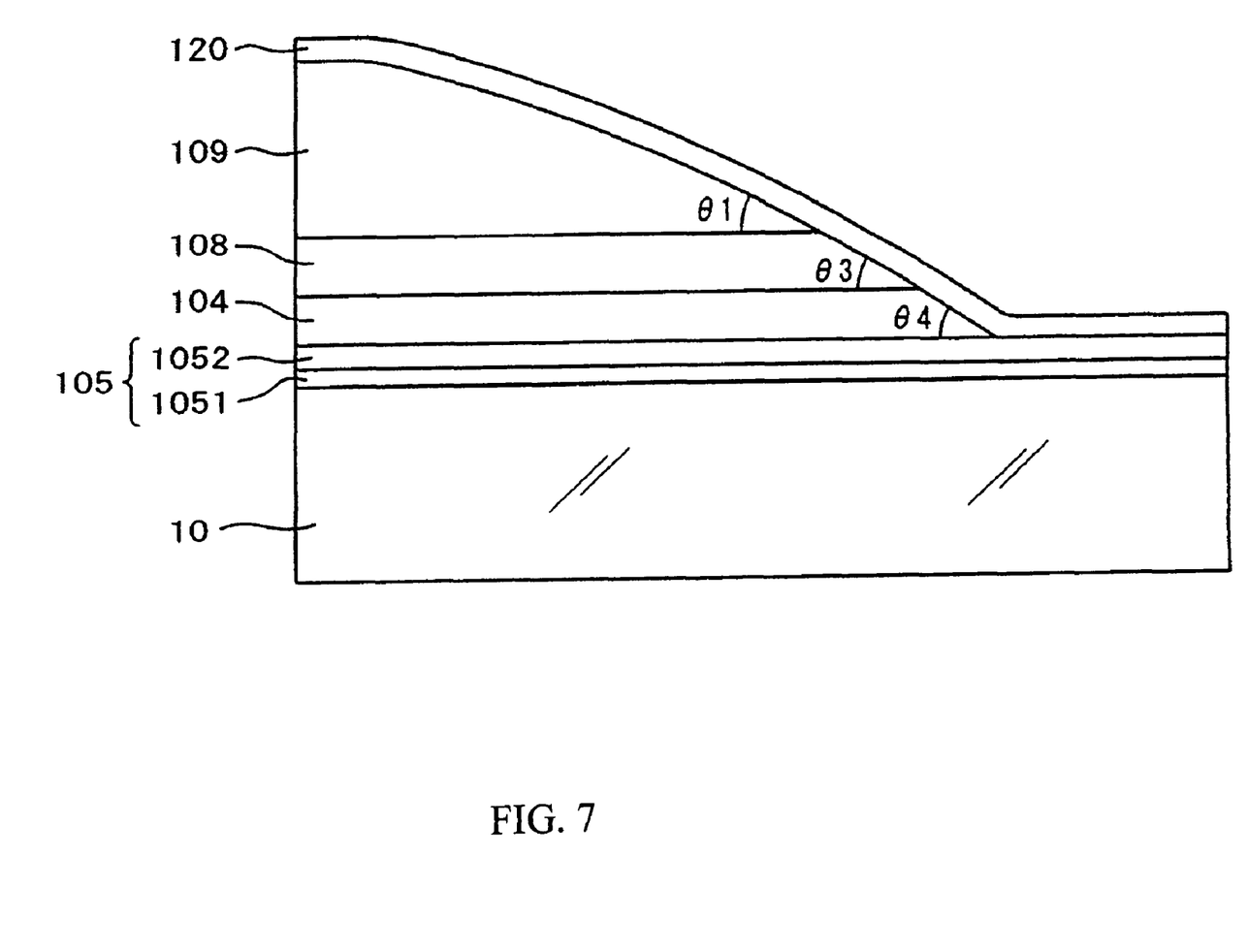
FIG. 7 is a cross sectional diagram showing a terminal portion according to the second embodiment.

FIG. 7 is a cross sectional diagram showing the structure of a terminal portion according to the present invention, which corresponds to a case where α-Si type TFT's are used. In FIG. 7, a gate wire 105 extends outward from the display region including pixels. The gate wire 105 uses an Al—Nd alloy layer 1051, in order to reduce the electrical resistance. In order to prevent a hillock from being created from Al and prevent Al from diffusing, the Al—Nd alloy layer 1051 is covered with a gate cap 1052 formed of an MoCr alloy.

In the terminal portion, the gate wire 105 is covered with two layers of SiN films: a gate insulating film 104 and an inorganic passivation film 108, and further covered with an organic passivation film 109. In the terminal portion, a through hole is created in the organic passivation film 109, the inorganic passivation film 108 and the gate insulating film 104, for electrical connection to an external circuit. In order to prevent the gate electrode 105 from corroding in the air, the terminal portion is covered with a transparent conductive film formed of a metal oxide. The transparent conductive film uses ITO, which is also used for the pixel electrode 110, and is formed at the same time as the pixel electrode 110.

Figure 8:
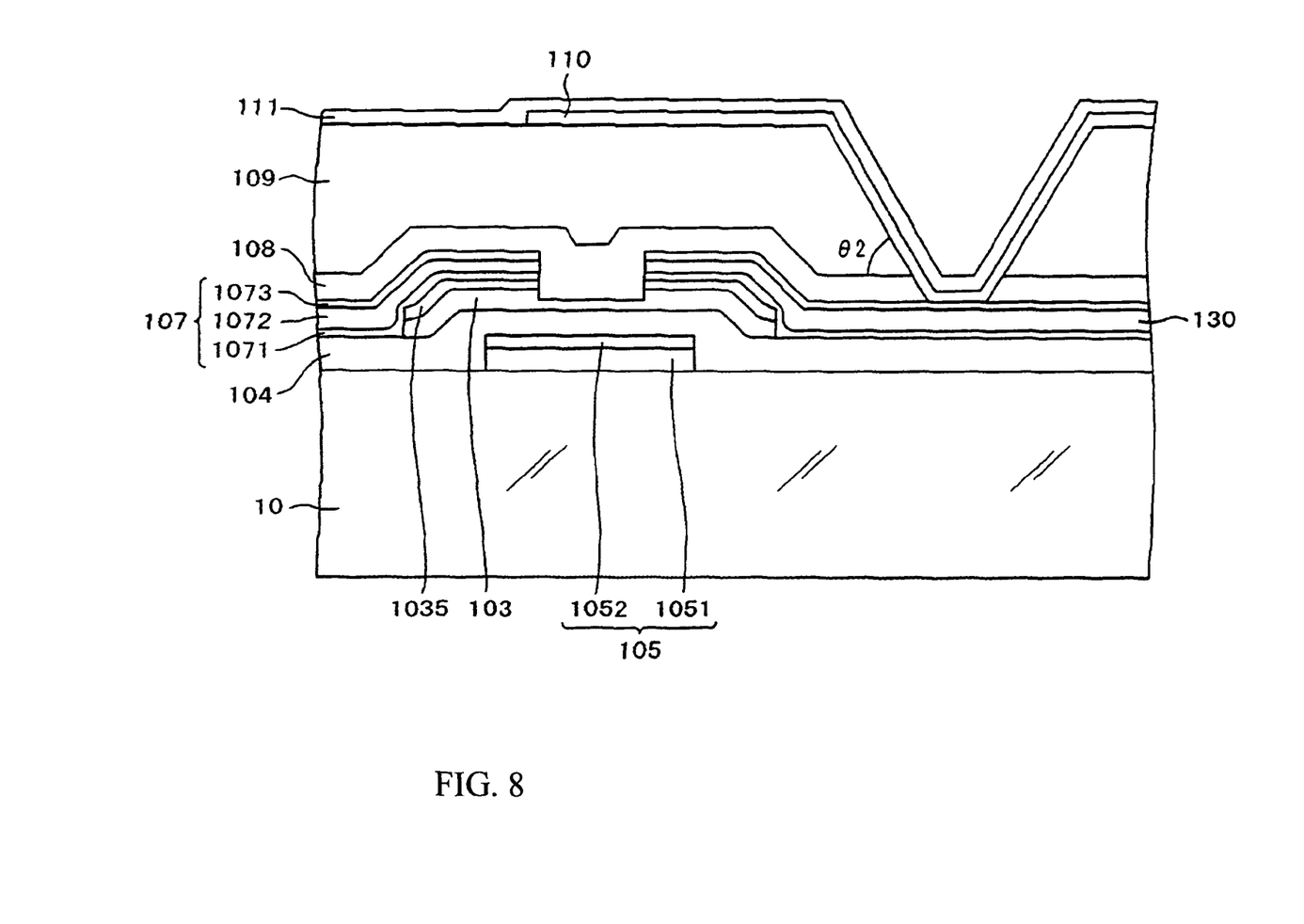
FIG. 8 is a cross sectional diagram showing a pixel portion according to the first embodiment.

FIG. 8 is a cross sectional diagram showing a pixel portion which corresponds to FIG. 7, specifically, a TFT portion. In FIG. 8, a gate electrode 105 is formed on a glass substrate 10. The gate electrode 105 is formed in the same manner as the gate wire 105 in FIG. 7. A gate insulating film 104 is formed so as to cover the gate electrode 105. Unlike in the case of the first embodiment, the gate insulating film 104 is formed of an SiN film in accordance with a CVD method. A semiconductor layer 103 is formed of α-Si on top of the gate insulating film 104. In order to improve the electrical connection between the semiconductor layer 103 and the SD electrode 107, an n+Si layer 1035 is formed between the α-Si layer and the SD electrode 107. The SD electrode 107 formed of three layers and a drain electrode 130 are formed on top of the n+Si layer 1035. The configuration of the SD electrode 107 and the drain electrode 130 is the same as in the first embodiment.

After the SD electrode 107 and the drain electrode 130 are patterned through photolithography, the n+Si layer 1035 and the channel of the α-Si layer are etched using the SD electrode 107 and the drain electrode 130 as a resist so that the whole can be operated as a TFT. After that, the entirety of the TFT is covered with an inorganic passivation film 108, and the top is covered with an organic passivation film 109, as in the first embodiment. The organic passivation film 109 works as a flattened film, and is formed so as to have a thickness of approximately 1 μm to 4 μm. In the present embodiment, the film thickness of the organic passivation film 109 is 3 μm. A pixel electrode 110 is formed on top of the organic passivation film 109.

In order to make electrical connection between the pixel electrode 110 and the drain electrode 130, a through hole is created in the organic passivation film 109 and the inorganic passivation film 108. The pixel electrode 110 is formed on top of the organic passivation film 109 and inside the through hole. An orientation film 111 is formed on top of the pixel electrode 110, and a rubbing process is carried out on this orientation film 111, as in the first embodiment. Shavings 1111 of the orientation film are created during the rubbing process.

In FIG. 8, as the taper angle θ2 of the through hole in the organic passivation film 109 in the pixel portion becomes smaller, the area of the through hole increases, making the transmittance of the pixel lower, and thus, the brightness of the screen lowers. Accordingly, the taper angle θ2 of the through hole in the pixel portion cannot be reduced very much. This is the same as in the case of the first embodiment.

Meanwhile, as described in the first embodiment, when the taper angle of the through hole in the terminal portion is large, shavings 1111 of the orientation film get into the terminal portion, causing defects in the conduction in the terminal portion. As shown in FIG. 7, the taper angle θ1 of the through hole in the organic passivation film 109 in the terminal portion is smaller than the taper angle θ2 in the organic passivation film 109 in the pixel portion also in the present embodiment.

As in the first embodiment, in order to make the taper angle θ1 of the through hole in the organic passivation film 109 and the thickness of the organic passivation film 109 in the periphery of the through hole smaller, half-tone exposure to light or multiple gradation half-tone exposure to light is used. The half-tone exposure to light and multiple gradation exposure to light are the same as described in reference to FIGS. 3 to 5.

Thus, when a through hole is created in the organic passivation film 109, the taper angle θ1 of the through hole can be made 5 degrees to 35 degrees, or 20 degrees to 35 degrees, in the case of half-tone exposure to light, and the film thickness of the organic passivation film 109 in the periphery of the through hole can be made 300 nm to 600 nm. In addition, in the case of multiple gradation half-tone exposure to light, the taper angle of the through hole can be made 20 degrees or less, and the film thickness of the organic passivation film 109 in the periphery of the through hole can be made 100 nm or less. Here, in the case where the organic passivation film 109 is too thin, it does not have a protective function, and therefore, 100 nm to 600 nm is desirable.

After a through hole is created in the organic passivation film 109, the inorganic passivation film 108 and the gate insulating film 104 are etched using the organic passivation film 109 as a resist, so that the gate wire 105 is exposed. The inorganic passivation film 108 and the gate insulating film 104 are both formed of SiN, and therefore, etching can be carried out at once. The taper angle θ3 of the inorganic passivation film 108 and the taper angle θ4 of the through hole in the gate insulating film 104 are in many cases both different from the taper angle θ1 of the through hole in the organic passivation film 109. An important point in the present embodiment is that the taper angle θ1 of the through hole in the organic passivation film 109 and the film thickness of the organic passivation film 109 in the periphery of the through hole are smaller. After the inorganic passivation film 108 and the gate insulating film 104 are etched, the terminal portion is covered with ITO 120, so that the gate wire 105 is protected.

As described above, the film thickness of the organic passivation film 109 in the periphery of the terminal portion and the taper angle of the through hole in the organic passivation film 109 are smaller in liquid crystal display devices having bottom gate type TFT's, and thus, shavings 1111 of the orientation film can be prevented from getting into the terminal portion, so that defects in the conduction can be prevented in the terminal portion.

The invention claimed is:

1. A liquid crystal display device, comprising a display region where pixels including a pixel electrode and a TFT are formed in regions surrounded by video signal lines and scanning lines, and terminal portions formed outside said display region, characterized in that an organic insulating film is formed so as to cover said TFT, and the organic insulating film in said pixel portion has a thickness of 1 μm to 4 μm, said pixel electrode is formed on top of said organic insulating film, and a pixel portion through hole for electrically connecting said pixel electrode and said TFT is created in said organic insulating film, a video signal line or a scanning line extends to said terminal portion outside said display region, and said video signal line or scanning line is covered with said organic insulating film, and a terminal portion through hole is created in said organic insulating film in said terminal portion, said organic insulating film in the periphery of said terminal portion through hole has a thickness of 300 nm to 600 nm, the taper angle of said terminal portion through hole in said organic insulating film is smaller than the taper angle of said pixel portion through hole in said organic insulating film, and the taper angle of said terminal portion through hole in said organic insulating film is 5 degrees to 35 degrees.

2. The liquid crystal display device according to claim 1, characterized in that the taper angle of said terminal portion through hole in said organic insulating film is 20 degrees to 30 degrees.

3. The liquid crystal display device according to claim 1, characterized in that there is an inorganic insulating film beneath said organic insulating film in said terminal portion.

4. A liquid crystal display device, comprising a display region where pixels including a pixel electrode and a TFT are formed in regions surrounded by video signal lines and scanning lines, and terminal portions formed outside said display region, characterized in that an organic insulating film is formed so as to cover said TFT, and the organic insulating film in said pixel portion has a thickness of 1 μm to 4 μm, said pixel electrode is formed on top of said organic insulating film, and a pixel portion through hole for electrically connecting said pixel electrode and said TFT is created in said organic insulating film, a video signal line or a scanning line extends to said terminal portion outside said display region, and said video signal line or scanning line is covered with said organic insulating film, and a terminal portion through hole is created in said organic insulating film in said terminal portion, said organic insulating film in the periphery of said terminal portion through hole has a thickness of 100 nm to 600 nm, the taper angle of said terminal portion through hole in said organic insulating film is smaller than the taper angle of said pixel portion through hole in said organic insulating film, and the taper angle of said terminal portion through hole in said organic insulating film is 20 degrees or less.

5. The liquid crystal display device according to claim 4, characterized in that there is an inorganic insulating film beneath said organic insulating film in said terminal portion.

6. A liquid crystal display device, comprising a display region where pixels including a pixel electrode and a TFT are formed in regions surrounded by video signal lines and scanning lines, and terminal portions formed outside said display region, characterized in that an organic insulating film is formed so as to cover said TFT, and the organic insulating film in said pixel portion has a thickness of 1 μm to 4 μm, said pixel electrode is formed on top of said organic insulating film, and a pixel portion through hole for electrically connecting said pixel electrode and said TFT is created in said organic insulating film, a video signal line or a scanning line extends to said terminal portion outside said display region, and said video signal line or scanning line is covered with said organic insulating film, and a terminal portion through hole is created in said organic insulating film in said terminal portion, the film thickness of said organic insulating film in the periphery of said terminal portion through hole is smaller than the film thickness of said organic insulating film in said pixel portion after half-tone exposure to light, the taper angle of said terminal portion through hole in said organic insulating film is smaller than the taper angle of said pixel portion through hole in said organic insulating film, and the taper angle of said terminal portion through hole in said organic insulating film is 5 degrees to 35 degrees.

7. The liquid crystal display device according to claim 6, characterized in that the film thickness of said organic insulating film in the periphery of said terminal portion through hole is 300 nm to 600 nm.

8. The liquid crystal display device according to claim 6, characterized in that the taper angle of said terminal portion through hole in said organic insulating film is 20 degrees to 30 degrees.

9. A liquid crystal display device, comprising a display region where pixels including a pixel electrode and a TFT are formed in regions surrounded by video signal lines and scanning lines, and terminal portions formed outside said display region, characterized in that an organic insulating film is formed so as to cover said TFT, and the organic insulating film in said pixel portion has a thickness of 1 µm to 4 µm, said pixel electrode is formed on top of said organic insulating film, and a pixel portion through hole for electrically connecting said pixel electrode and said TFT is created in said organic insulating film, a video signal line or a scanning line extends to said terminal portion outside said display region, and said video signal line or scanning line is covered with said organic insulating film, and a terminal portion through hole is created in said organic insulating film in said terminal portion, the film thickness of said organic insulating film in the periphery of said terminal portion through hole is smaller than the film thickness of said organic insulating film in said pixel portion after multiple gradation half-tone exposure to light, the taper angle of said terminal portion through hole in said organic insulating film is smaller than the taper angle of said pixel portion through hole in said organic insulating film, and the taper angle of said terminal portion through hole in said organic insulating film is 20 degrees or less.

10. The liquid crystal display device according to claim 9, characterized in that the film thickness of said organic insulating film in the periphery of said terminal portion through hole is 100 nm to 600 nm.

* * * * *